United States Patent
Duqi et al.

(10) Patent No.: US 11,079,298 B2
(45) Date of Patent: Aug. 3, 2021

(54) MEMS PRESSURE SENSOR WITH MULTIPLE SENSITIVITY AND SMALL DIMENSIONS

(71) Applicant: STMicroelectronics S.r.l., Agrate Brianza (IT)

(72) Inventors: Enri Duqi, Milan (IT); Lorenzo Baldo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 253 days.

(21) Appl. No.: 16/260,723

(22) Filed: Jan. 29, 2019

(65) Prior Publication Data
US 2019/0242772 A1    Aug. 8, 2019

(30) Foreign Application Priority Data
Feb. 2, 2018  (IT) .................. 102018000002367

(51) Int. Cl.
*G01L 9/00* (2006.01)
*G01L 19/14* (2006.01)
(Continued)

(52) U.S. Cl.
CPC ............ *G01L 19/141* (2013.01); *B81B 7/007* (2013.01); *B81B 7/0051* (2013.01);
(Continued)

(58) Field of Classification Search
CPC ..... G01L 19/147; G01L 9/0042; G01L 19/04; G01L 9/0054; G01L 9/0072; G01L 13/025; G01L 19/14; G01L 19/0038; G01L 19/0084; G01L 9/0055; G01L 9/0075; G01L 19/0069; G01L 9/0052; G01L 9/0073; G01L 19/0092; G01L 19/0618;
(Continued)

(56) References Cited

U.S. PATENT DOCUMENTS 9,688,531 B2    6/2017 Baldo et al.
2005/0208696 A1*   9/2005 Villa .................. G01L 9/0073
                                                                    438/53
(Continued)

FOREIGN PATENT DOCUMENTS

EP    1 577 656 A1    9/2005
EP    3 098 584 A1    11/2016

OTHER PUBLICATIONS

Kim et al., "Temperature Sensitivity in Silicon Piezoresistive Pressure Transducers," *IEEE Transactions on Electron Devices*, ED-30(7):802-810, Jul. 1983.

*Primary Examiner* — Andre J Allen
(74) *Attorney, Agent, or Firm* — Seed IP Law Group LLP

(57) ABSTRACT

A MEMS pressure sensor includes a monolithic body of semiconductor material having a first face and a second face and housing a first buried cavity and a second buried cavity, arranged under the first buried cavity and projecting laterally therefrom. A first sensitive region is formed between the first buried cavity and the first face at a first depth, and a second sensitive region is formed between the second buried cavity and the first face at a second depth greater than the first depth. The monolithic body also houses a first piezoresistive sensing element and a second piezoresistive sensing element, integrated in the first and second sensitive regions, respectively.

18 Claims, 14 Drawing Sheets

(51) Int. Cl.
    *G01L 19/00*     (2006.01)
    *B81B 7/00*     (2006.01)
    *B81C 1/00*     (2006.01)
    *G01L 19/12*     (2006.01)

(52) U.S. Cl.
    CPC ........ *B81C 1/00182* (2013.01); *G01L 9/0052* (2013.01); *G01L 9/0054* (2013.01); *G01L 19/0007* (2013.01); *G01L 19/0084* (2013.01); *G01L 19/12* (2013.01); *G01L 19/145* (2013.01)

(58) Field of Classification Search
    CPC . G01L 19/0645; G01L 19/143; G01L 9/0051; G01L 19/0007; G01L 19/0046; G01L 19/06; G01L 19/0627; G01L 19/0681; G01L 27/002; G01L 9/00; G01L 9/0041; G01L 9/0044; G01L 11/025; G01L 11/04; G01L 19/0023; G01L 19/0672; G01L 19/069; G01L 19/142; G01L 19/145; G01L 19/16; G01L 7/00; G01L 9/0047; G01L 9/06; G01L 9/065; G01L 9/12; G01L 11/02; G01L 13/00; G01L 15/00; G01L 19/0015; G01L 19/003; G01L 19/02; G01L 19/0609; G01L 19/083; G01L 19/10; G01L 19/148; G01L 27/005; G01L 7/08; G01L 7/082; G01L 7/163; G01L 7/166; G01L 9/0045; G01L 9/0048; G01L 9/006; G01L 9/007; G01L 9/0076; G01L 9/04; G01L 9/045; G01L 9/125; G01L 11/00; G01L 17/00; G01L 19/00; G01L 19/0076; G01L 19/08; G01L 19/141; G01L 19/146; G01L 1/142; G01L 1/2262; G01L 1/246; G01L 21/12; G01L 23/16; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/08; G01L 9/085; G01L 9/105; G01L 9/14; G01L 9/16; H01L 2224/48091; H01L 2924/00014; H01L 2224/48137; H01L 2224/48145; H01L 2224/73265; H01L 2924/00012; H01L 2224/04105; H01L 2224/24137; H01L 2224/49175; H01L 24/19; H01L 2924/1461; H01L 2924/1815; H01L 2924/18162; H01L 29/84; H01L 41/047; H01L 41/0475; H01L 41/1132
    USPC ..................................................... 73/700–756
    See application file for complete search history.

(56) References Cited

U.S. PATENT DOCUMENTS

| | | | |
|---|---|---|---|
| 2013/0270658 A1* | 10/2013 | Behrendt | B81C 1/00531 257/415 |
| 2016/0236931 A1* | 8/2016 | Chau | G01L 9/0073 |
| 2016/0236932 A1* | 8/2016 | Chau | B81C 1/00246 |
| 2016/0349129 A1 | 12/2016 | Pagani et al. | |
| 2016/0377496 A1* | 12/2016 | Chiou | G01L 19/0007 73/727 |
| 2019/0145842 A1* | 5/2019 | Zhang | G01L 9/008 257/417 |
| 2021/0039946 A1* | 2/2021 | Sakuragi | B81B 3/0021 |

\* cited by examiner

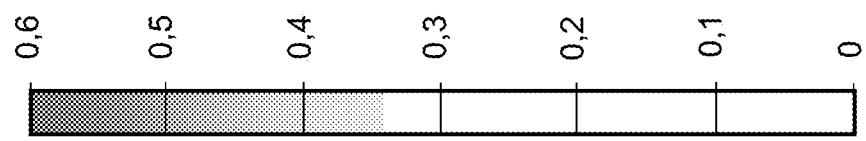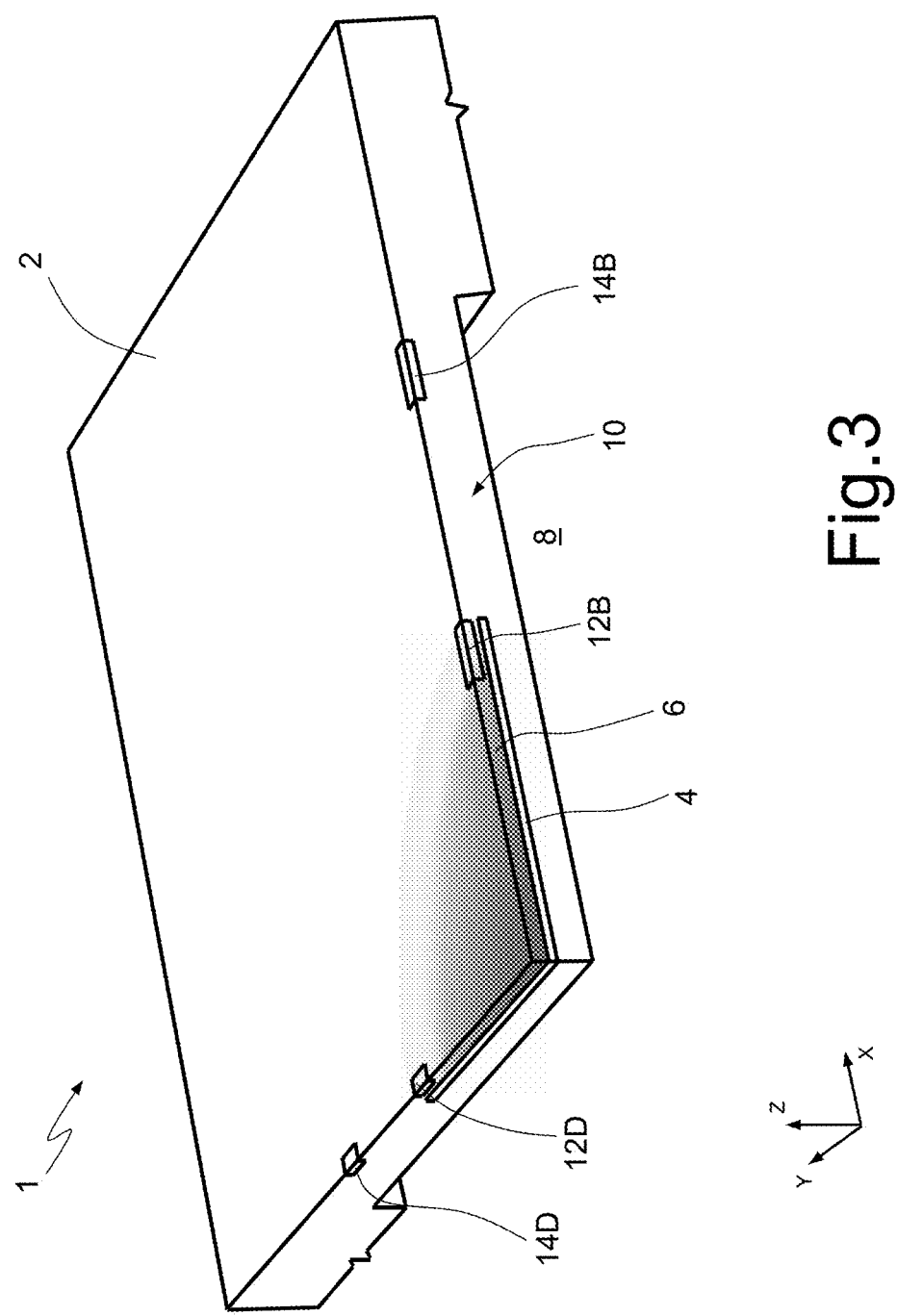
Fig.3

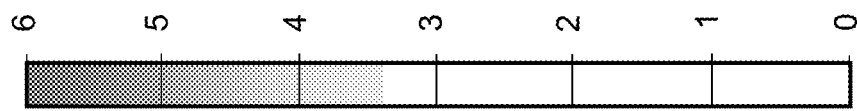
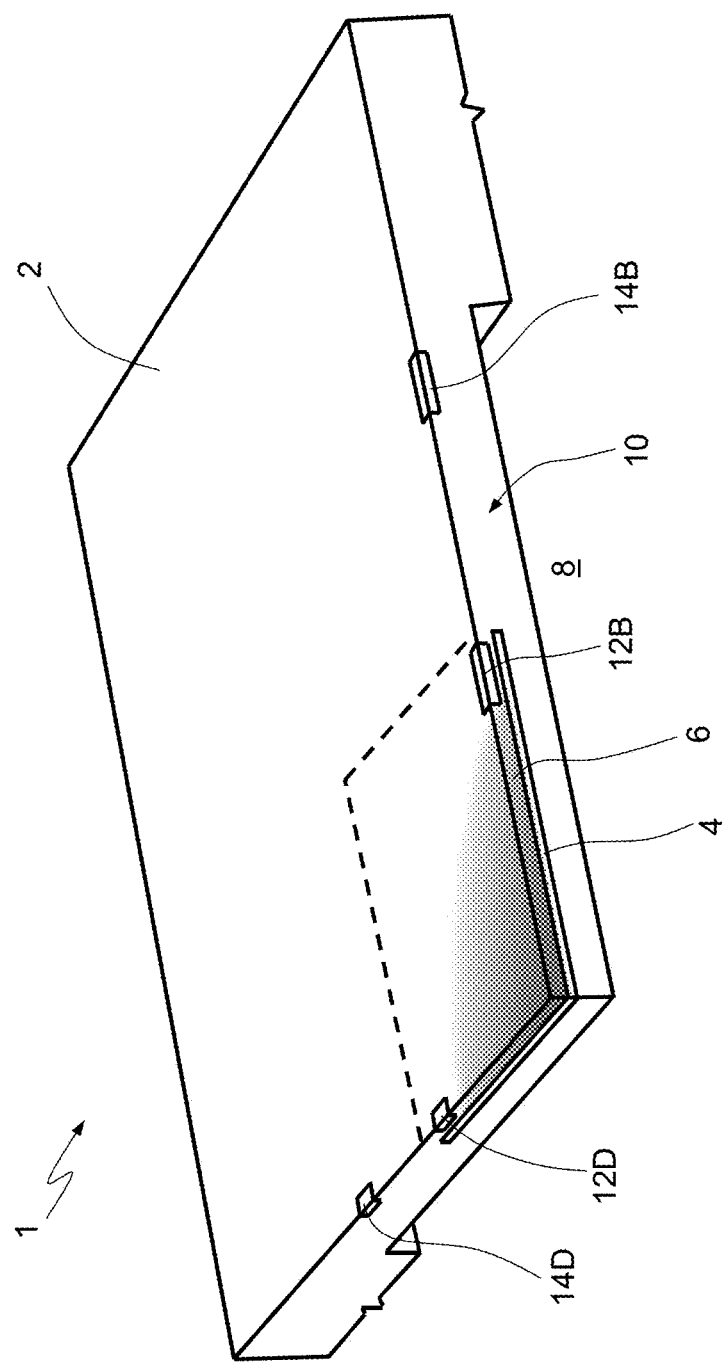
Fig.4

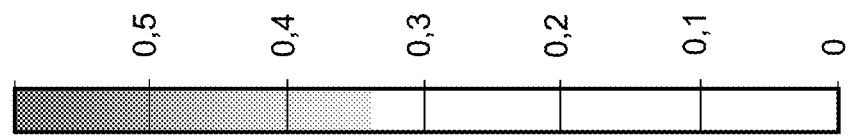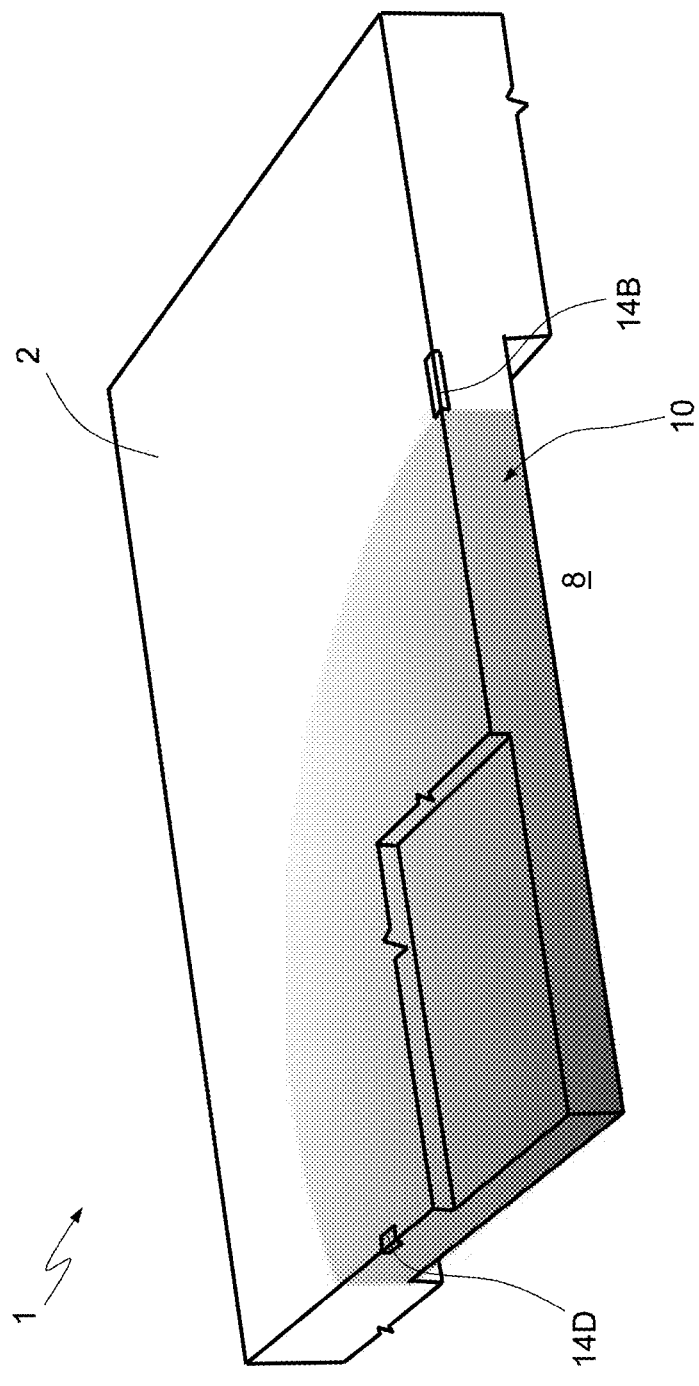
Fig.5

MEMS PRESSURE SENSOR WITH MULTIPLE SENSITIVITY AND SMALL DIMENSIONS

BACKGROUND

Technical Field

The present disclosure relates to a MEMS (Micro-Electro-Mechanical Systems) pressure sensor with multiple sensitivity and small dimensions.

Description of the Related Art

As is known, sensors that include micromechanical structures, of, at least in part, semiconductor materials using MEMS technology are increasingly widespread, by virtue of the advantageous characteristics of small dimensions, low manufacturing costs and flexibility.

A MEMS sensor comprises a micro-electro-mechanical sensing structure, which transduces a physical quantity of a mechanical type to be detected into a physical quantity of an electrical type (e.g., correlated to a capacitive variation) and generates a corresponding electrical signal; and an electronic reading circuit, for example, an ASIC (Application-Specific Integrated Circuit), which processes the electrical signal and supplies an output signal, of analog (e.g., a voltage) or digital type (e.g., a PDM—Pulse-Density Modulation—signal). The output signal, eventually processed by an electronic interface circuit, is then supplied to an external electronic system, for example a microprocessor control circuit of an electronic apparatus incorporating the MEMS sensor.

MEMS sensors comprise, for example, sensors of physical quantities, such as inertial sensors, which detect data of acceleration, angular velocity, etc.; sensors of derived signals, such as quaternions (data representing rotations and directions in the three-dimensional space) and gravity signals; motion detectors, such as step and height counters and pedometers; and environmental signals, which detect quantities such as pressure, temperature, and humidity.

To detect the physical quantity, MEMS sensors of the type considered comprise at least one membrane or layer, formed in or on a semiconductor die and suspended over one or more cavities. The membrane may face the external environment or be in communication with the latter through a fluidic path; moreover, the physical quantity is detected using one or more sensing elements, such as, for example, piezoresistive sensing elements, arranged at the membrane or the sensor layer.

Hereinafter, reference will chiefly be made to MEMS pressure sensors; however, without any loss of generality, similar considerations may be also extended to sensors of different nature.

In MEMS pressure sensors, in use, the pressure to be detected causes a deflection of the membrane proportional to the degree of pressure; this deformation causes a variation of the electrical resistivity of the material forming the piezoresistive elements, thus generating an electrical signal. The electrical signal is then read and processed by the electronic reading circuits, coupled to the MEMS pressure sensor. Then, the processed signal can be transmitted to external electronic systems or circuits, coupled to the MEMS pressure sensor.

In some applications, it is desirable for the pressure sensor to be able to operate in different, or even very different, pressure ranges. For instance, devices such as smartwatches or devices for managing sporting activities and the like, frequently comprise applications measuring the external pressure in different ranges, for example for everyday applications, managing navigation for stationary bicycles, height monitoring during a climb, measuring diving depth, etc., and are thus able both to measure the variations of atmospheric pressure during the day and to measure the pressure of the water during a dive.

Known solutions implement, for example, MEMS pressure sensors that have single-membrane structures or structures with side by side membranes, designed and manufactured to operate in particular pressure ranges.

Likewise, in case of MEMS pressure-sensor structures with side by side membranes, the latter are shaped so as to be particularly sensitive in different pressure ranges.

However, present solutions have some disadvantages.

In particular, the area occupied by the membrane or membranes according to these known solutions is generally rather large. This renders their integration in devices or systems of small dimensions complex.

Moreover, such sensors may have low performance in one or more of the sensitivity ranges, thus reducing the reliability and efficiency of the sensor over its entire operating range. In particular, this problem particularly arises in single-membrane MEMS pressure sensors.

BRIEF SUMMARY

In various embodiments, the present disclosure provides a MEMS pressure sensor with multiple sensitivity and small dimensions that overcomes some or all of the drawbacks of the prior art.

According to the present disclosure, a MEMS pressure sensor is provided. In one embodiment, the present disclosure provides a MEMS pressure sensor that includes a body of semiconductor material having a first face and a second face. A first buried cavity is disposed in the body, and a first sensitive region is disposed in the body between the first buried cavity and the first face. The first buried region has a first depth. A second buried cavity is disposed in the body between the first buried cavity and the second face, and the second buried cavity extends laterally beyond sides of the first buried cavity. A second sensitive region is disposed in the body between the second buried cavity and the first face, and the second sensitive region has a second depth greater than the first depth and extends laterally with respect to the first sensitive region. A first piezoresistive sensing element is provided in the first sensitive region, and a second piezoresistive sensing element is provided in the second sensitive region.

BRIEF DESCRIPTION OF THE SEVERAL VIEWS OF THE DRAWINGS

For a better understanding of the present disclosure, some embodiments of the present disclosure are now described, purely by way of non-limiting example, with reference to the attached drawings, wherein:

FIG. 3 shows the displacement caused on a portion of a MEMS pressure sensor according to embodiments of the present disclosure when a first external pressure is applied;

FIG. 4 shows the displacement caused on a first part of the portion of the sensor of FIG. 3 when a second external pressure is applied;

FIG. 5 shows the displacement caused on a second part of the portion of the sensor of FIGS. 3 and 4 when the second external pressure is applied;

DETAILED DESCRIPTION

Figure 1:
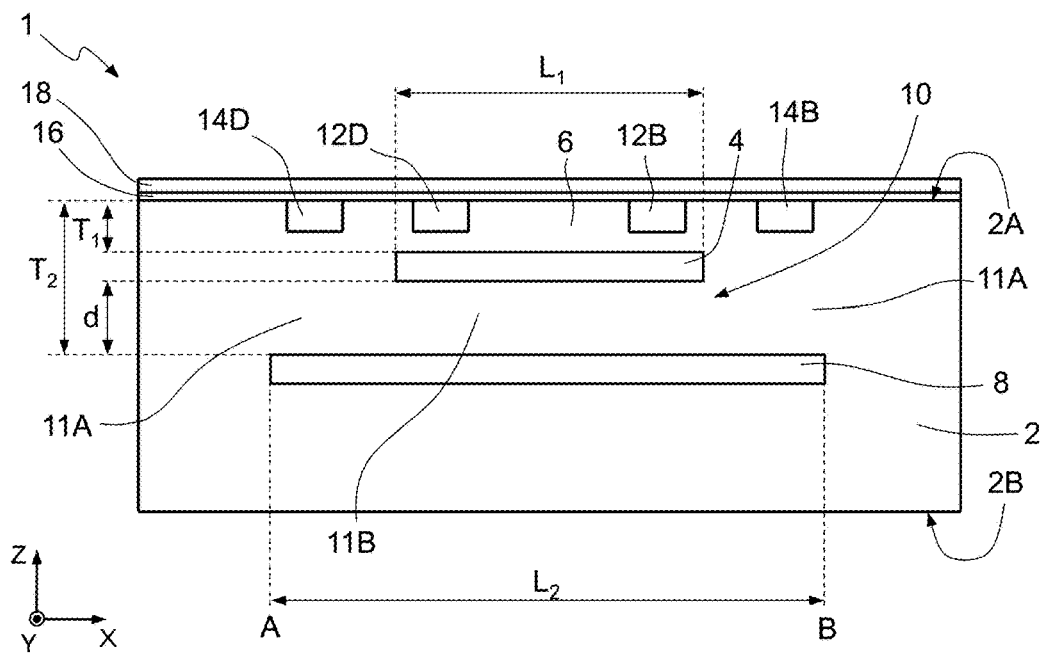
FIG. 1 is a schematic cross-section taken along section line I-I of FIG. 2 of a MEMS pressure sensor according to one embodiment.
Figure 2:
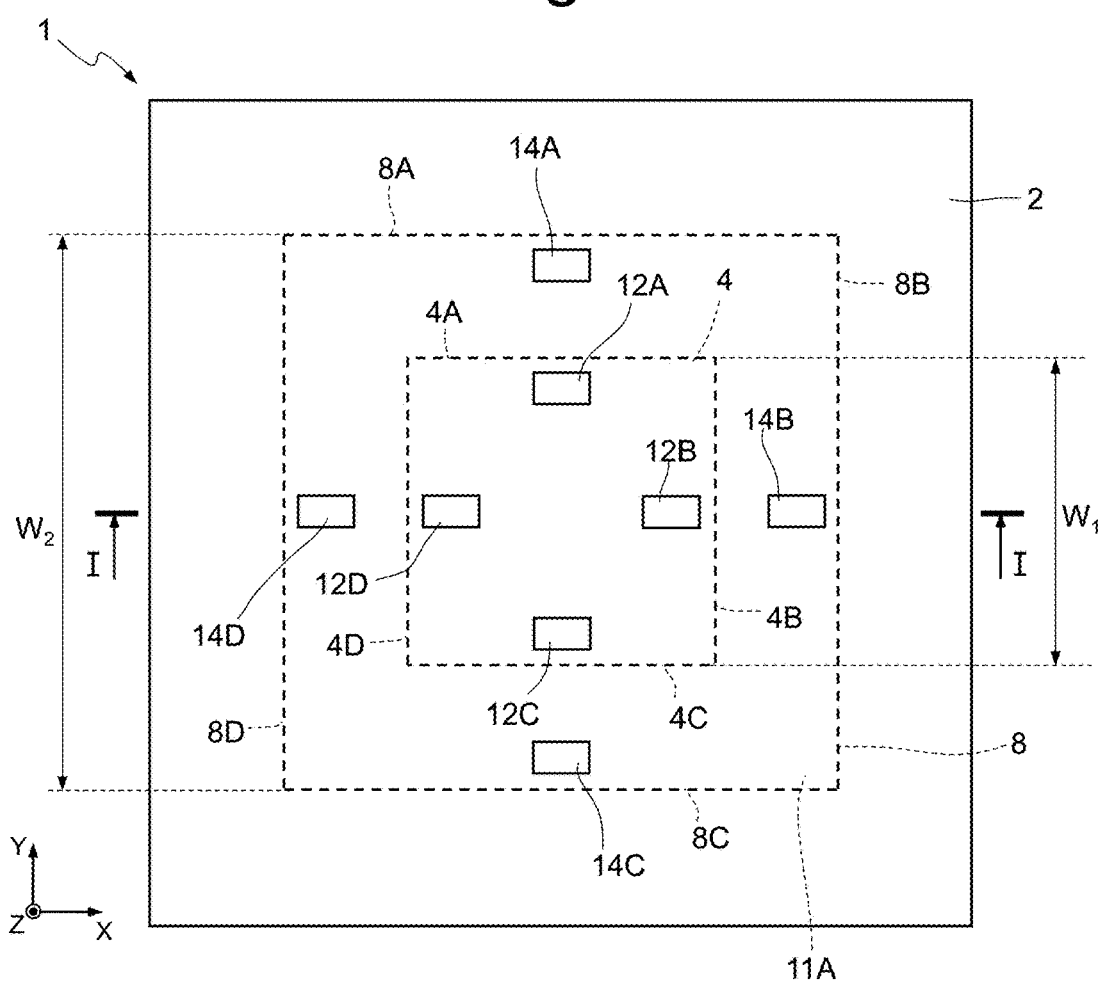
FIG. 2 is a schematic top plan view of the MEMS pressure sensor of FIG. 1.

FIGS. 1 and 2 show an embodiment of a MEMS pressure sensor 1.

In the following description, the term "depth" will be used to indicate the extension of each constitutive element of the present MEMS pressure sensor 1 along a first axis Z of a Cartesian reference system XYZ, shown, for example, in FIG. 1. Likewise, the terms "length" and "width" indicate, respectively, the extension of each constitutive element of the present MEMS pressure sensor 1 along a second axis X and a third axis Y of the Cartesian reference system XYZ.

The MEMS pressure sensor 1 comprises a monolithic body 2 of semiconductor material (e.g., silicon), with a here generally parallelepiped shape, having a first and a second face 2A, 2B both extending in planes parallel to the plane XY of the Cartesian reference system XYZ.

The monolithic body 2 houses a first buried cavity 4 (FIG. 1), arranged underneath (parallel to the axis Z) the first face 2A and having main dimensions in a plane parallel to the plane of extension of the first face 2A. In detail, the first buried cavity 4 has a first length $L_1$ and a first width $W_1$; moreover, the first buried cavity 4 has, a, for example, quadrangular (e.g., square) shape in top plan view (illustrated dashed in FIG. 2), having a first, a second, a third, and a fourth side 4A-4D.

The first buried cavity 4 delimits underneath a first sensitive region (hereinafter, indicates as first membrane 6) in the monolithic body 2 of FIG. 1; in particular, the first membrane 6 extends from the first face 2A for a first depth $T_1$.

Moreover, the monolithic body 2 houses a second buried cavity 8, arranged below the first face 2A and the first buried cavity 8 and having main dimensions in a plane parallel to the plane of extension of the first face 2A. In detail, the second buried cavity 8 is arranged at a second depth $T_2$ from the first face 2A; moreover, the second buried cavity 8 has a second length $L_2$ and a second width $W_2$. Moreover, the second buried cavity 8 has a, for example, quadrangular (e.g., square) shape in top plan view (illustrated dashed in FIG. 2), and has a fifth, a sixth, a seventh, and an eighth side 8A-8D.

In particular, the second depth $T_2$ of the second buried cavity 8 is greater than the first depth $T_1$ of the first buried cavity 4 (FIG. 1), and the second buried cavity 8 is arranged below the first buried cavity 4 in the monolithic body 2 at a first distance d.

Moreover, the second length $L_2$ of the second buried cavity 8 is greater than the first length $L_1$ of the first buried cavity 4. In other words, the second buried cavity 8 projects laterally and parallel to the second axis X with respect to the first buried cavity 4 on at least one side thereof. In particular, in the embodiment of FIGS. 1 and 2, the second buried cavity 8 projects symmetrically with respect to the first buried cavity 4. In practice, in planes parallel to the plane of the first face 2A, the second buried cavity 8 has an area greater than the first buried cavity 4.

The same geometrical considerations presented above for the lengths $L_1$ and $L_2$ of the buried cavities 4, 8 also apply to the widths $W_1$ and $W_2$ (FIG. 2) of the buried cavities 4, 8. Moreover, in top plan view (FIG. 2), the first and second buried cavities 4, 8 are concentric.

The second buried cavity 8 delimits underneath a second sensitive region (called hereinafter as second membrane 10, the lateral extension whereof is indicated in FIG. 1 by dashed delimitation lines A, B). The second membrane 10 comprises a first portion 11A, of an annular shape, and a second portion 11B, of a quadrangular shape. The first portion 11A extends between the first face 2A and the second cavity 8, externally from the first cavity 4 in top plan view (FIG. 2), and has a depth equal to the second depth $T_2$. The second portion 11B extends between the first buried cavity 4 and the second buried cavity 8, is laterally surrounded by the first portion 11A, and has a depth equal to the first distance d.

The monolithic body 2 moreover houses first and second piezoresistive sensing elements 12A-12D, 14A-14D, extending from the first face 2A, as illustrated in FIG. 1.

As shown in FIG. 2, the first piezoresistive sensing elements 12A-12D are arranged in the first membrane 6, in the proximity of respective sides 4A-4D, and the second piezoresistive sensing elements 14A-14D are arranged in the first portion 11A of the second membrane 10, in the proximity of respective sides 8A-8D. Said arrangement enables the first piezoresistive sensing elements 12A-12D to detect the pressure (or variations thereof) acting on the first membrane 6 and the second piezoresistive sensing elements 14A-14D to detect the pressure (or variations thereof) acting on the second membrane 10. In a way not illustrated, the piezoresistive sensing elements 12A-12D and 14A-14D form respective Wheatstone bridges.

With reference to FIG. 1, the MEMS pressure sensor 1 further comprises: an insulating layer 16, made, for example, of silicon oxide ($SiO_2$), which extends on the first face 2A; and a plurality of conductive paths 18, which are made, for example, of polysilicon or metal (such as aluminum), and extending on the insulating layer 16, for electrical connection with an external electronic biasing/reading/processing circuit (not illustrated).

One or more features of the MEMS pressure sensor 1 may be manufactured in a manner similar to those described in the U.S. Pat. No. 9,688,531 (filed Jun. 23, 2017, and assigned to the assignee of the present application) and in the European patent EP 1577656 (filed Mar. 19, 2004, and assigned to the assignee of the present application). In some embodiments, the MEMS pressure sensor 1 may be formed by first forming the second buried cavity 8, then carrying out one or more steps of epitaxial growth, and repeating process steps described in the aforesaid patents to obtain the first buried cavity 4.

Then, provided on the first face 2A are the first and second piezoresistive sensing elements 12A-12D, 14A-14D via steps of diffusion or implantation of dopant ion species.

Next, the oxide layer 16 and a conductive layer are deposited in sequence according to known deposition techniques, and the conductive layer may be utilized to form the conductive paths 18.

In use, when a force/pressure acts on the first face 2A of the MEMS pressure sensor 1, it can cause a deflection of either just the first membrane 6 or both of the membranes 6, 10, according to its amplitude, as highlighted in the simulations of FIGS. 3-5.

In detail, FIG. 3 shows the degree of the displacement of the membranes 6, 10 of the MEMS pressure sensor 1 in the case of application of a force of 1 bar (0.1 MPa). In particular, in FIG. 3 shades of grey are used, where lighter shades represent smaller displacements, and darker shades represent increasingly greater displacements.

As may be noted, for this value of force, only the first membrane 6 is deflected and undergoes a displacement towards the inside of the first cavity 4. Consequently, only the first piezoresistive sensing elements 12A-12D (of which only the elements 12B and 12D are visible in FIG. 3) generate a detectable electrical signal, which is sent to external reading and/or processing circuits.

FIGS. 4 and 5 show the same MEMS pressure sensor 1 of FIGS. 1 and 2, to which there has been applied a force of 10 bar (1 MPa), thus ten times higher than the load referred to in FIG. 3.

In particular, FIG. 4 (where for reasons of clarity the second membrane 10 is represented in see-through view, with a thin line) shows, in increasingly darker shades of grey, the displacement of the first membrane 6, and FIG. 5 (where for reasons of clarity the first membrane 6 is represented in see-through view, with a thin line) shows the displacement of the second membrane 10. As may be noted, in this case, both the first membrane 6 and the second membrane 10 are deflected. Consequently, both the first piezoresistive sensing elements 12A-12D and the second piezoresistive sensing elements 14A-14D generate corresponding electrical signals sent to the external reading and/or processing circuits (not illustrated), for determining the degree of the exerted force.

As may be noted from the values of displacement represented in the simulations, the displacement of the first membrane 6 at high pressures (FIG. 4) increases by a factor of ten with respect to the displacement of the first membrane 6 at low pressures (FIG. 3) and thus in a way proportional to the force applied. In addition, at high pressures, the distribution of the displacement of the second membrane 10 (FIG. 5) is substantially equal to the distribution of the displacement of the first buried cavity 6 in conditions of low pressure (FIG. 3).

Moreover, further simulations (not illustrated) conducted by the present applicant have shown that, as the force acting on the MEMS pressure sensor 1 increases, also the stress on the first membrane 6 and/or on the second membrane 10 increases according to the same law, without modifying its own distribution, enabling a corresponding increase of the sensitivity of the sensor.

In fact, the sensitivity of the present MEMS pressure sensor 1 may be calculated by means of the known equation of Chung and Wise for a Wheatstone bridge (see the paper "Temperature sensitivity in silicon piezoresistive pressure transducers", IEEE Transactions on Electron Devices, 30, 7, July, 1983):

$$S \sim V \cdot \pi \cdot (\sigma_x - \sigma_y) \quad (1)$$

where S is the sensitivity of the MEMS pressure sensor 1; V is the voltage generated by the first/second piezoresistive sensing elements 12A-12D, 14A-14D (which are connected in Wheatstone-bridge configuration, as mentioned above); $\pi$ is the piezoresistive coefficient of the first/second piezoresistive sensing elements 12A-12D, 14A-14D; and $\sigma_x$, $\sigma_y$ are the stresses generated by the force along the second and third axes X, Y, respectively, of the Cartesian reference system XYZ, the difference of which is directly proportional, according to known laws, to the displacement of the membrane due to the application of an external force. Eq. (1) in particular shows that the sensitivity of the MEMS pressure sensor 1 is directly proportional to the difference between the stresses $\sigma_x$, $\sigma_y$ along the second and third axes X and Y and, through the detected voltage V, to the deformation of the first membrane 6 and/or the second membrane 10.

It may be noted that, even in the presence of a force uniformly applied on the first membrane 6 and/or on the second membrane 10, the difference between the stresses $\sigma_x$, $\sigma_y$ is not zero. In fact, the first and second piezoresistive sensing elements 12A-12D, 14A-14D are arranged so that the piezoresistive sensing elements 12A, 12C, 14A, 14C are parallel to the sides 4A, 4C, 8A, 8C, respectively, and that the piezoresistive sensing elements 12B, 12D, 14B, 14D are transverse to the sides 4B, 4D, 8B, 8D, respectively (as illustrated in detail in FIG. 2).

In this way, in the presence of a uniform load, the stresses $\sigma_x$, $\sigma_y$ are the same, but the response of the piezoresistive sensing elements 12A, 12C, 14A, 14C is different from the response of the piezoresistive sensing elements 12B, 12D, 14B, 14D; consequently, the difference between the stresses $\sigma_x$, $\sigma_y$ is not zero.

Consequently, the sensitivity S of the MEMS pressure sensor 1 in the conditions of low pressure (FIG. 3) or high pressure (FIGS. 4 and 5) increases linearly with the increase of the pressure acting on the MEMS pressure sensor 1. In this way, irrespective of the pressure range considered, the MEMS pressure sensor 1 is able to detect the external pressure without any reduction in performance.

Figure 6:
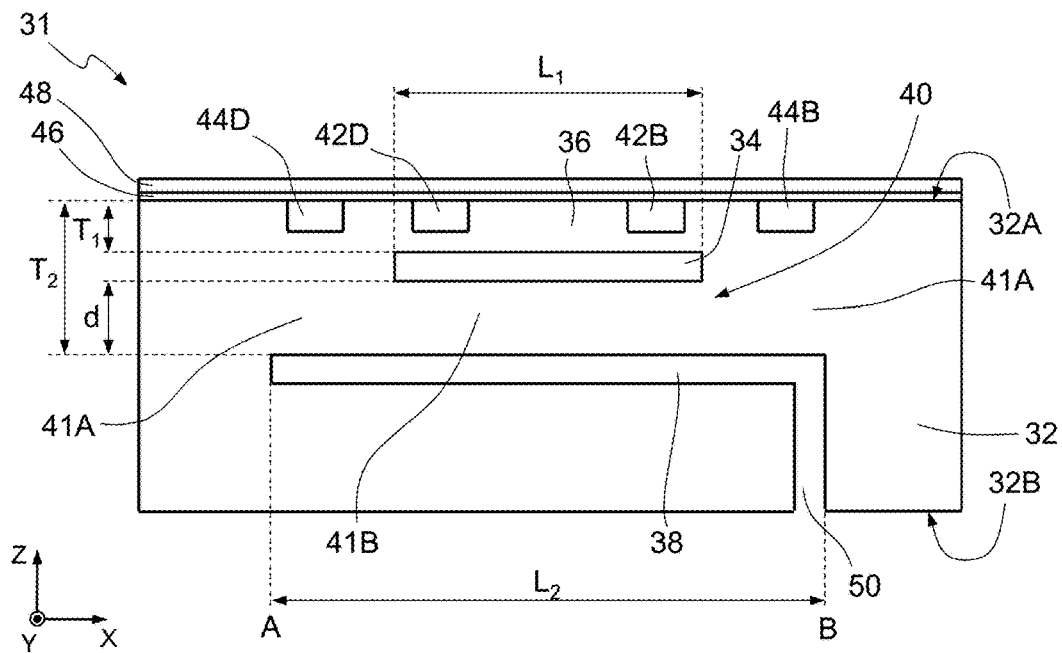
FIG. 6 is a schematic cross-section taken along section line VI-VI of FIG. 7 of a MEMS pressure sensor according to another embodiment.
Figure 7:
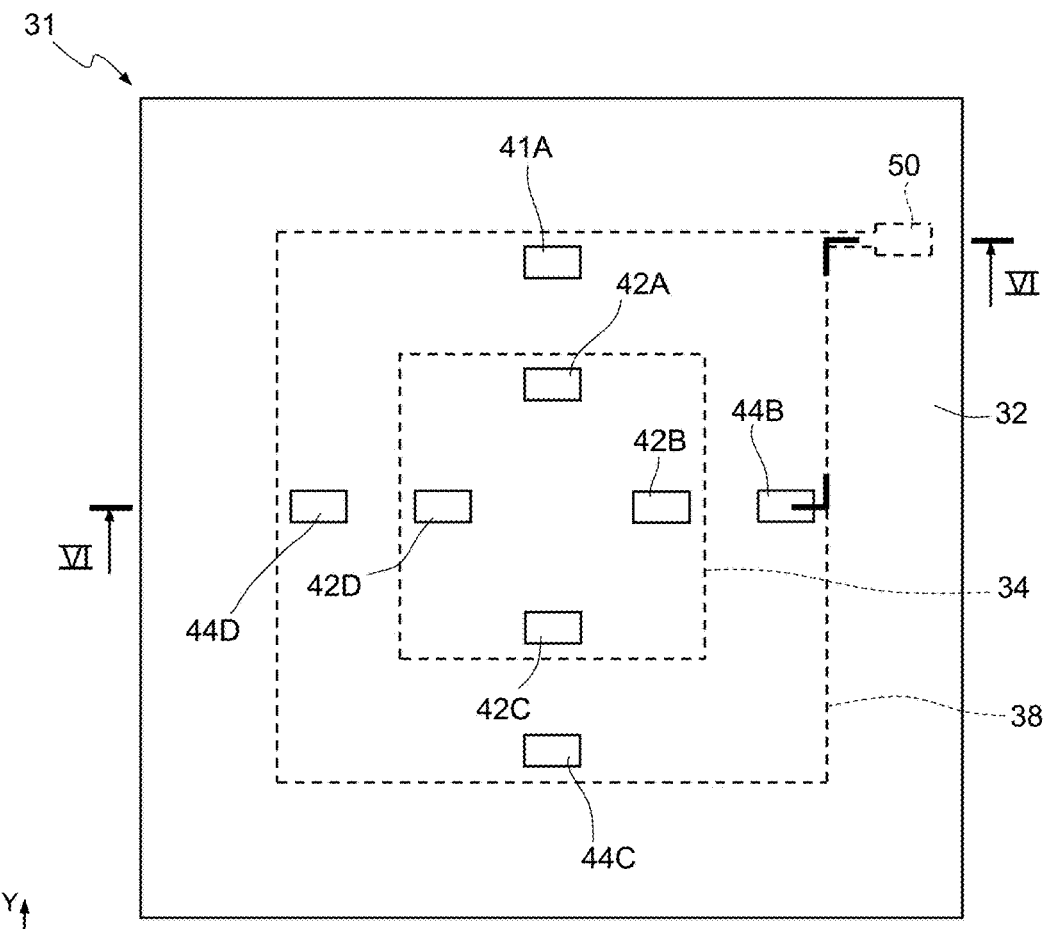
FIG. 7 is a schematic top plan view of the MEMS pressure sensor of FIG. 6.

FIGS. 6 and 7 show another embodiment of the present MEMS pressure sensor. In detail, FIGS. 6 and 7 show a MEMS pressure sensor 31 of a differential type having a general structure similar to that of the MEMS pressure sensor 1 of FIGS. 1 and 2. Thus, parts that are similar to the ones illustrated and described with reference to FIGS. 1 and 2 are designated in FIGS. 6 and 7 by reference numbers increased by 30 and will not be described any further.

In particular (FIG. 6), the monolithic body 32 comprises a first access channel 50, extending in the direction of the first axis Z from the second face 32B up to the second buried cavity 38 and fluidically connecting the second buried cavity 38 with the external environment.

The MEMS pressure sensor 31 is manufactured according to the manufacturing process described for the MEMS pressure sensor 1 of FIGS. 1 and 2, added to which are known masking and definition steps for providing the first access channel 50.

The MEMS pressure sensor 31 undergoes the same deformations and has the same sensitivity as the MEMS pressure sensor 1 of FIGS. 1 and 2, as discussed in particular with reference to FIGS. 3-5, but operates both in an absolute way and in a differential way.

In fact, in use, the first face 32A of the MEMS pressure sensor 32 is subject to the pressure to be detected, and the second face 32B is exposed to the external environment. Thus, the second membrane 40 (which is arranged between the first face 32A and the second buried cavity 38) is subjected both to the pressure to be detected and to the ambient pressure as a result of the fluidic connection provided by the first access channel 50. Instead, the first membrane 36 operates as detector of absolute pressure, being arranged between the first face 32A of the MEMS pressure sensor 32 and the first buried cavity 34, which contains a gas at reference pressure.

Figure 8:
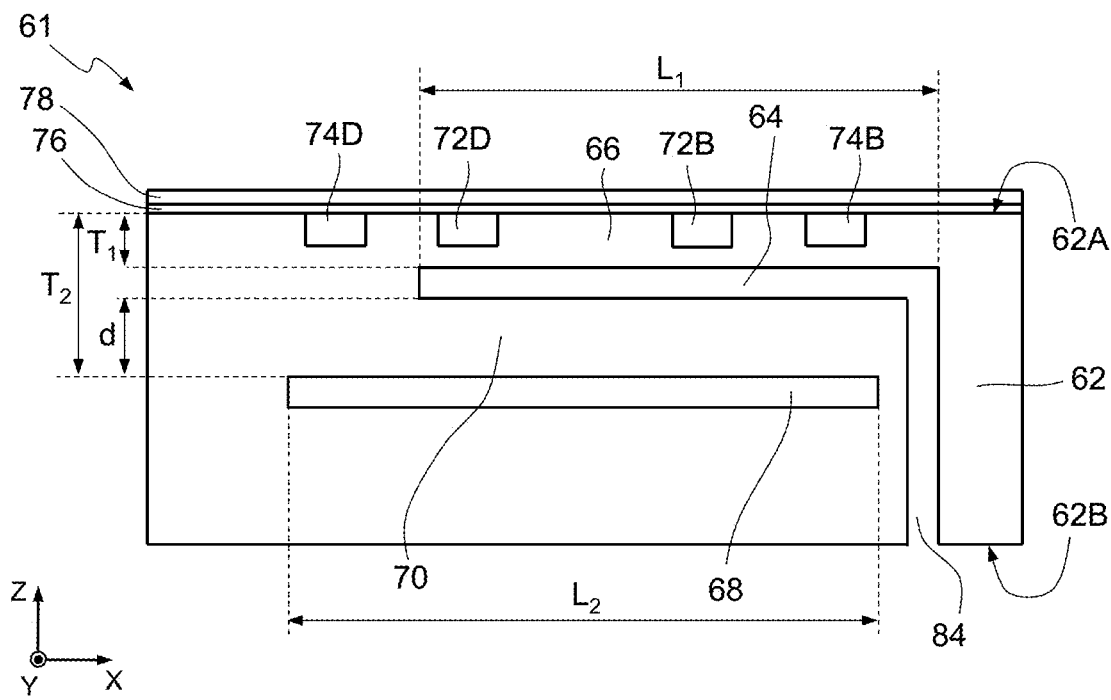
FIG. 8 is a schematic cross-section of a MEMS pressure sensor according to a further embodiment.

FIG. 8 shows a MEMS pressure sensor 61 having a general structure similar to that of the MEMS pressure sensor 1 of FIGS. 1 and 2 so that parts that are similar to the ones illustrated and described with reference to FIGS. 1 and 2 are designated in FIG. 8 by reference numbers increased by 60 and will not be described any further.

In detail, the monolithic body 62 comprises a second access channel 84 extending in the direction of the first axis Z from the second face 62B and configured to fluidically connect the first buried cavity 64 with the external environment.

The MEMS pressure sensor 61 is manufactured in a way similar to what has been described for the MEMS pressure sensor 31 of FIGS. 6 and 7.

In use, the MEMS pressure sensor 61 operates in a way similar to what has been discussed previously for the MEMS pressure sensor 31 of FIGS. 6 and 7, with the difference that, in this case, the first membrane 66 operates in a differential way since it is interposed between the first face 62A of the MEMS pressure sensor 61 (subject to the pressure to be detected) and the first buried cavity 64, which is connected to the external environment by means of the second access channel 84. Consequently, the first membrane 66 has a behavior similar to that of the second membrane 40 of the MEMS pressure sensor 31 of FIGS. 6 and 7, even though it operates in a different pressure range. Vice versa, the second membrane 70 operates in an absolute way.

Figure 9:
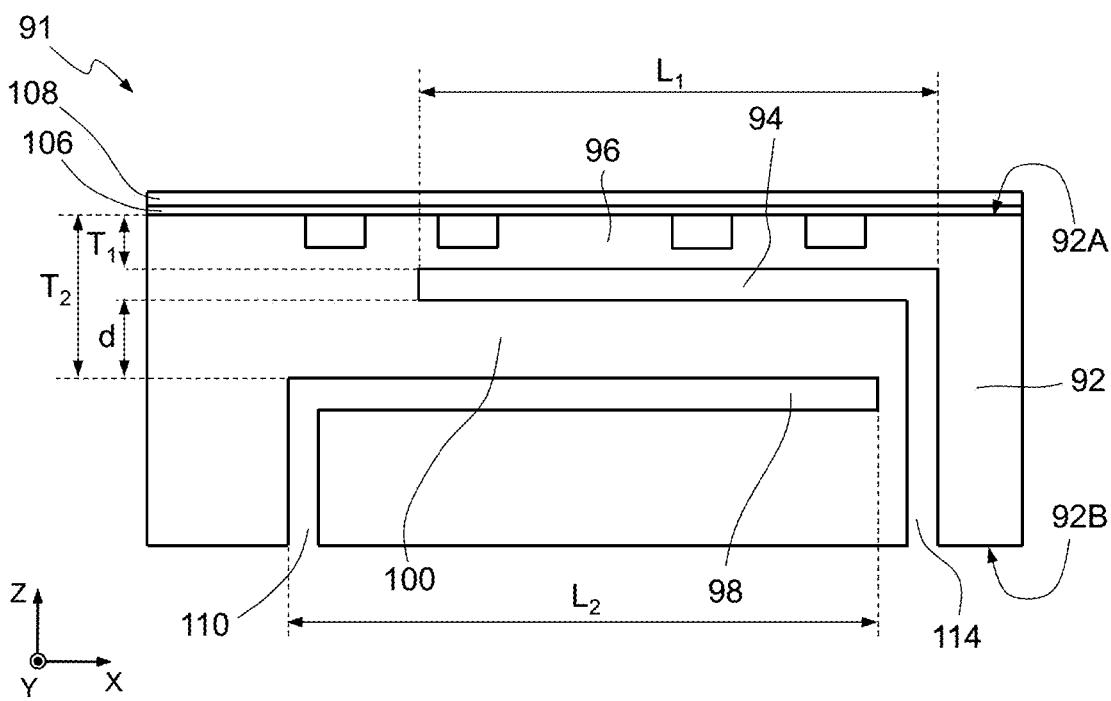
FIG. 9 is a schematic cross-section of a MEMS pressure sensor according to another embodiment.

FIG. 9 shows a MEMS pressure sensor 91 having a general structure similar to that of the MEMS pressure sensor 1 of FIGS. 1 and 2 so that parts that are similar to the ones illustrated and described with reference to FIGS. 1 and 2 are designated in FIG. 9 by reference numbers increased by 90 and will not be described any further.

In detail, the monolithic body 92 comprises a first access channel 110 and a second access channel 114, which extend along the first axis Z from the second face 92B and are configured to fluidically connect the second buried cavity 98 and the first buried cavity 94, respectively, with the external environment.

The MEMS pressure sensor 91 is manufactured in a way similar to what has been described for the MEMS pressure sensor 31 of FIGS. 6 and 7, here forming simultaneously the first and second access channels 110, 114.

In use, both the first and second membranes 96, 100 operate in a differential way since both are exposed, on the first face 92A, to the pressure to be measured and, on their own surface facing the first and second buried cavities 94, 98, to the ambient pressure through the first and second access channels 110, 114, respectively.

Figure 10:
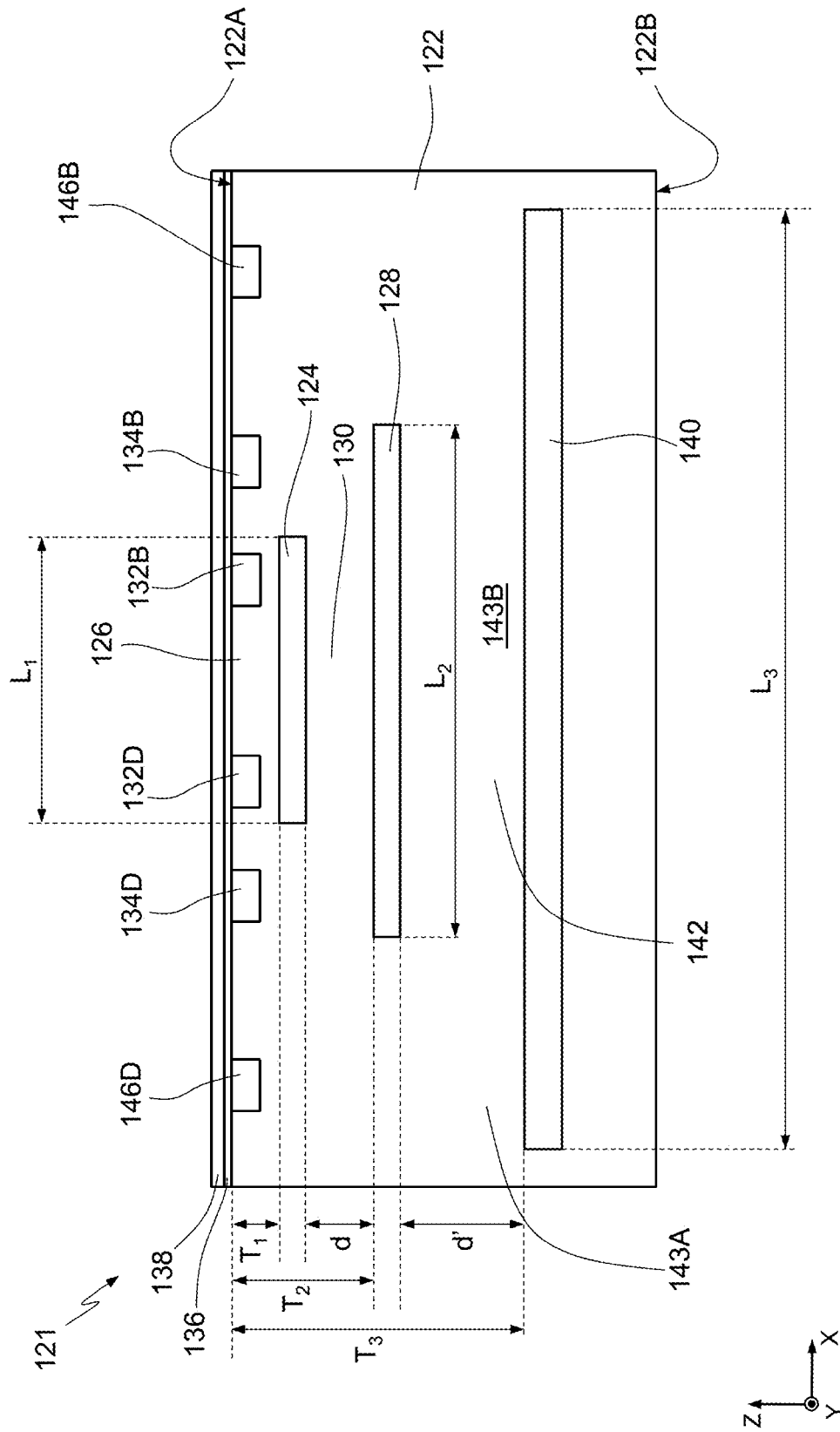
FIG. 10 is a schematic cross-section of a MEMS pressure sensor according to a further embodiment.

FIG. 10 shows a MEMS pressure sensor 121 having a general structure similar to that of the MEMS pressure sensor 1 of FIGS. 1 and 2, so that parts that are similar to the ones illustrated and described with reference to FIGS. 1 and 2 are designated in FIG. 10 by reference numbers increased by 120 and will not be described any further.

In particular, the monolithic body 122 houses a third buried cavity 140, having a shape that is, for example, quadrangular (in particular, square) in top plan view (not shown). The third buried cavity 140 is arranged underneath the second buried cavity 128, at a third depth $T_3$ from the first face 122A, has a third length $L_3$ in a direction parallel to the second axis X, and the same width (not shown) in a direction parallel to the third axis Y. In detail, the third depth $T_3$ is greater than the first and second depths $T_1$, $T_2$. Moreover, the third length $L_3$ is greater than the first and second lengths $L_1$, $L_2$. In addition, the third buried cavity 140 projects on all sides (for example, symmetrically, as illustrated in FIG. 10 for the third length $L_3$) with respect to the second buried cavity 128, being concentric to the first and second buried cavities 134, 138. The third buried cavity 140 is arranged underneath the second buried cavity 138 at a second distance d' in the direction of the depth.

The third buried cavity 140 delimits underneath a third sensitive region (defined hereinafter also as third membrane 142). The third membrane 142 comprises a first portion 143A, having an annular shape (as the first portion 11A of the first membrane illustrated in FIG. 2), and a second portion 143B, having a quadrangular shape. The first portion 143A of the third membrane 142 extends between the first face 122A and the third buried cavity 140, on the outside of the first and second buried cavities 124, 128 in top plan view (not represented) and has a depth equal to the third depth $T_3$. The second portion 143B of the third membrane 142 extends between the second buried cavity 128 and the third buried cavity 140, is laterally surrounded by the first portion 143A, and has a depth equal to the second distance d'.

Analogously to what described previously for the MEMS pressure sensors 1, 31, 61, 91 of FIGS. 1-2, 6-9, the monolithic body 122 comprises third piezoresistive sensing elements (only the piezoresistive sensing elements 146B and 146D whereof, aligned with one another in a direction parallel to the second axis X, are visible in FIG. 10, in addition to the first and second piezoresistive sensing elements 132B, 132D 134B, 134D). In detail, the third piezoresistive sensing elements 146A-146D are arranged on the first portion 143A of the third membrane 142, in proximity of its outer perimeter (corresponding to the outer perimeter of the third buried cavity 140).

In use, the MEMS pressure sensor 121 operates in an absolute way, as discussed previously for the MEMS pressure sensor 1 of FIGS. 1 and 2 and illustrated in greater detail in FIGS. 3-5.

Figure 11:
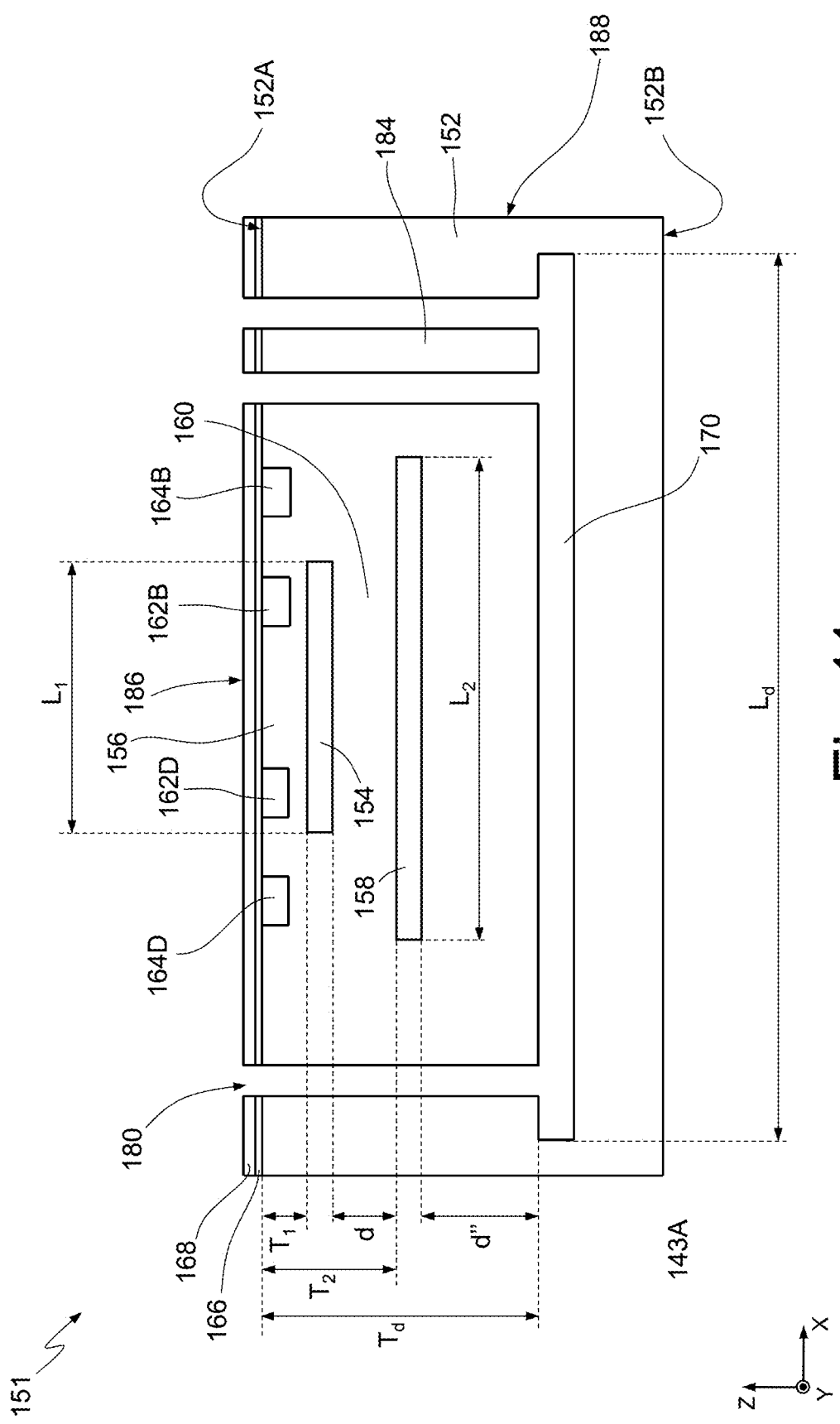
FIG. 11 is a schematic cross-section taken along section line XI-XI of FIG. 12 of a MEMS pressure sensor according to another embodiment.

With reference to FIG. 11, a MEMS pressure sensor 151 is illustrated having a general structure similar to that of the MEMS pressure sensor 1 of FIGS. 1 and 2, so that parts that are similar to the ones illustrated and described with reference to FIGS. 1 and 2 are designated in FIG. 11 by reference numbers increased by 150 and will not be described any further.

Figure 12:
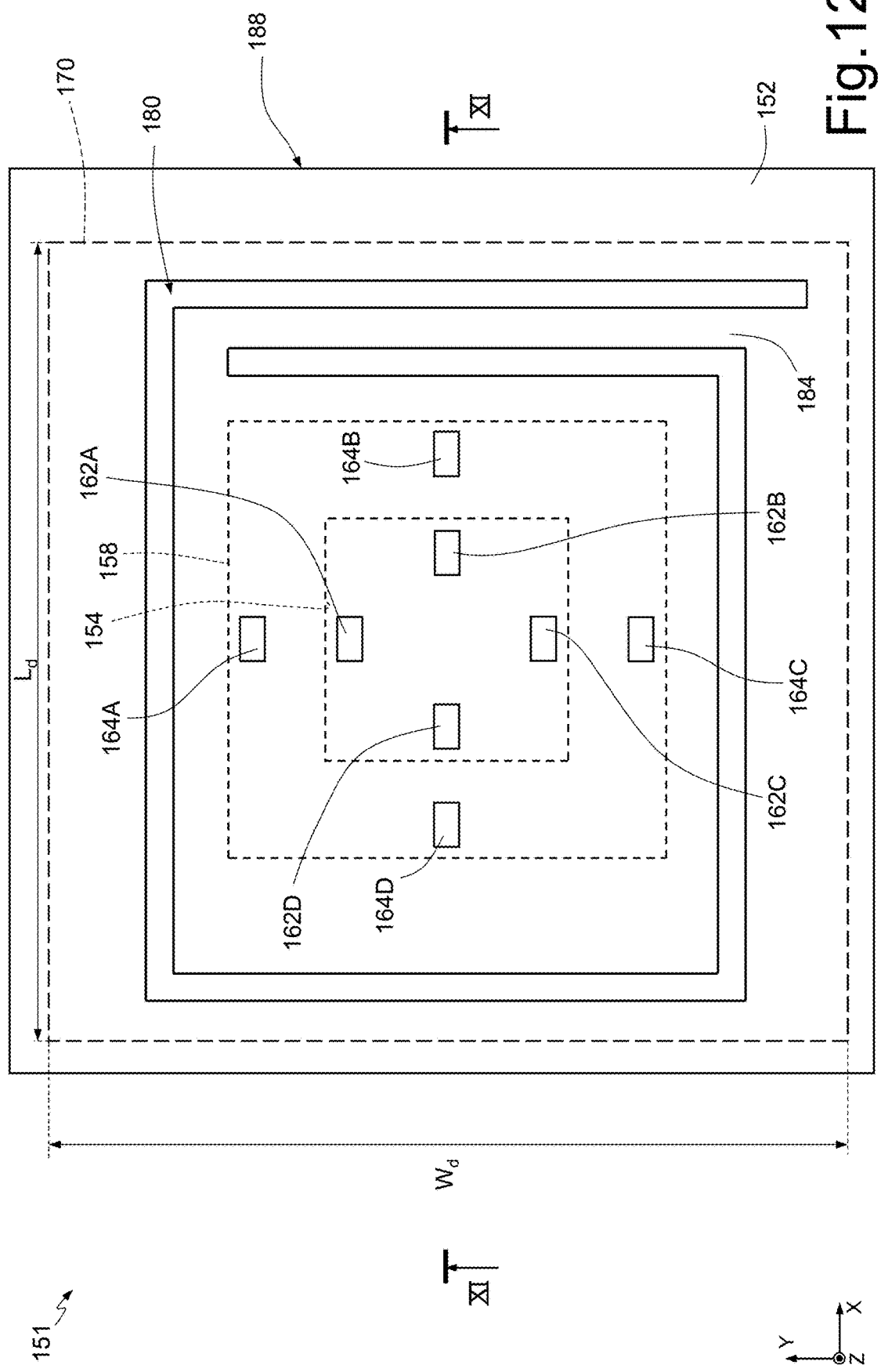
FIG. 12 is a schematic top plan view of the MEMS pressure sensor of FIG. 11.

In particular, the monolithic body 152 houses a decoupling cavity 170, having a shape that is, for example, quadrangular (e.g., square) in top plan view (illustrated dashed in FIG. 12). In addition (FIG. 11), the decoupling cavity 170 is arranged at a fourth depth $T_d$ from the first face 152A and has a fourth length $L_d$ and a fourth width $W_d$. In detail, the fourth depth $T_d$ is greater than the first and second depths $T_1$, $T_2$ of the first and second buried cavities 154, 158. Moreover, the fourth length $L_d$ is greater than the first and second lengths $L_1$, $L_2$ of the first and second buried cavities 154, 158. Consequently, the decoupling cavity 170 projects laterally (e.g., on both sides, as illustrated in FIG. 11) with respect to the second buried cavity 158 and is arranged underneath the latter at a third distance d".

Moreover, the monolithic body 152 has a decoupling trench 180, extending in a direction parallel to the axis Z from the first face 152A up to the decoupling cavity 170. The decoupling trench 180 has the shape, for example, of a square spiral in top plan view (FIG. 12) and laterally delimits a sensitive portion 186, corresponding to the portion of monolithic body 152 housing the first and second membranes 156, 160, and an arm or spring 184, which connects the sensitive portion 186 to a peripheral portion 188 of the monolithic body 152. In this way, it is possible to decouple the sensitive portion 186 of the MEMS pressure sensor 151 from the peripheral portion 188 of the monolithic body 152, from possible integrated electronic circuits or substrates that may be coupled to the MEMS pressure sensor 151, and from the stress induced by elements external to the MEMS pressure sensor 151, such as coupled integrated circuits, gluing resins, and package assembly elements.

The MEMS pressure sensor 151 is manufactured in a way similar to the pressure sensor 121 of FIG. 10, and a deep etch of the silicon is made until the decoupling cavity 170 is reached to form the decoupling trench 180.

Figure 13:
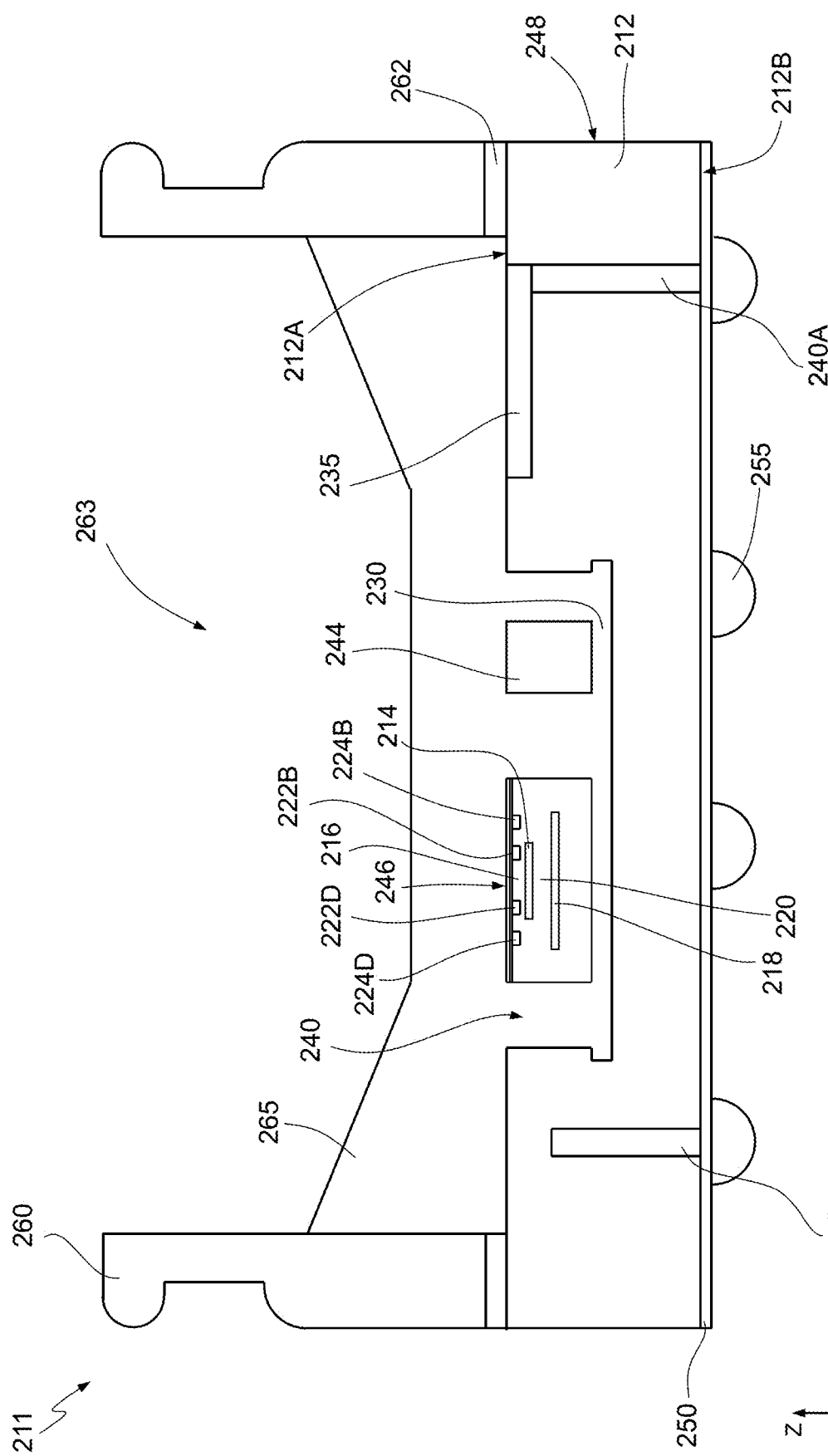
FIG. 13 is a cross-section of a MEMS pressure sensor according to a further embodiment.

FIG. 13 shows a MEMS pressure sensor 211 of a waterproof type, configured to be advantageously used in applications in hostile environments, such as an aquatic environment. In particular, the MEMS pressure sensor 211 has a general structure similar to that of the MEMS pressure sensor 151 of FIGS. 11 and 12, so that parts that are similar to the ones illustrated and described with reference to FIGS. 11 and 12 are designated in FIG. 13 by reference numbers increased by 60 and will not be described any further.

The monolithic body 212 houses an integrated electronic circuit 235, for example, an ASIC, formed in the proximity of the first face 212A.

The monolithic body 212 moreover houses a first and a second connection via 240A, 240B, which extend through the monolithic body 212 from the second face 212B to the first face 212A. The first and second connection vias 240A, 240B are formed using known masking and definition techniques. For example, the connection vias 240A, 240B are formed by opening through trenches, forming an insulation layer (not illustrated), for example made of silicon oxide, on the walls of the through trenches, and filling the through trenches with conductive material, such as copper.

The MEMS pressure sensor 211 further comprises a redistribution layer 250, arranged on the second face 212B of the MEMS pressure sensor 211, and made, for example, of aluminum, gold, or copper. Moreover, the MEMS pressure sensor 211 comprises a plurality of mechanical and electronic connection elements 255, arranged on the redistribution layer 250. In detail, the mechanical and electronic connection elements 255 may, for example, be constituted by so-called "solder balls" and mechanically and electrically connect the MEMS pressure sensor 211 to external reading and/or processing circuits.

The redistribution layer 250 is formed by a plurality of patterned conductive regions (not illustrated in detail), which electrically couple the MEMS pressure sensor 211 to the mechanical and electronic connection elements 255. In particular, the first connection via 240A electrically couples first conductive regions (not illustrated) of the redistribution layer 250 to the integrated electronic circuit 235, and the second connection via 240B electrically couples second conductive regions (not illustrated) of the redistribution layer 250 to the sensitive portion 246 of the MEMS pressure sensor 211. In particular, the second connection via 240B is in electrical contact with piezoresistive sensing elements 222A-222D, 224A-224D similar to the piezoresistive sensing elements 162A-162D, 164A-164D of FIG. 12.

The MEMS pressure sensor 211 further comprises a hollow cap 260, for example, of metal (such as steel), coupled to the first face 212A of the MEMS pressure sensor 211 by means of soldering techniques, such as tin soldering or using a gluing layer 262 (e.g., electrically conductive epoxy glue). In particular, the hollow cap 260 comprises a cap opening 263, which exposes part of the first face 212A of the MEMS pressure sensor 211 and surrounds the decoupling trench 240.

A gel layer 265 (e.g., silicone-based gel) is arranged in the cap opening 263, so as to coat the first-face portion 212A of the MEMS pressure sensor 210 exposed by the cap opening 263; moreover, the gel layer 265 fills the decoupling cavity 230 and the decoupling trench 240 of the MEMS pressure sensor 211 so as to render it water-proof.

In use, the electrical signal generated by the piezoresistive sensing elements 222A-222D, 224A-224D is sent to the integrated electronic circuit 235, which processes it and sends it out through the redistribution layer 250.

Figure 14:
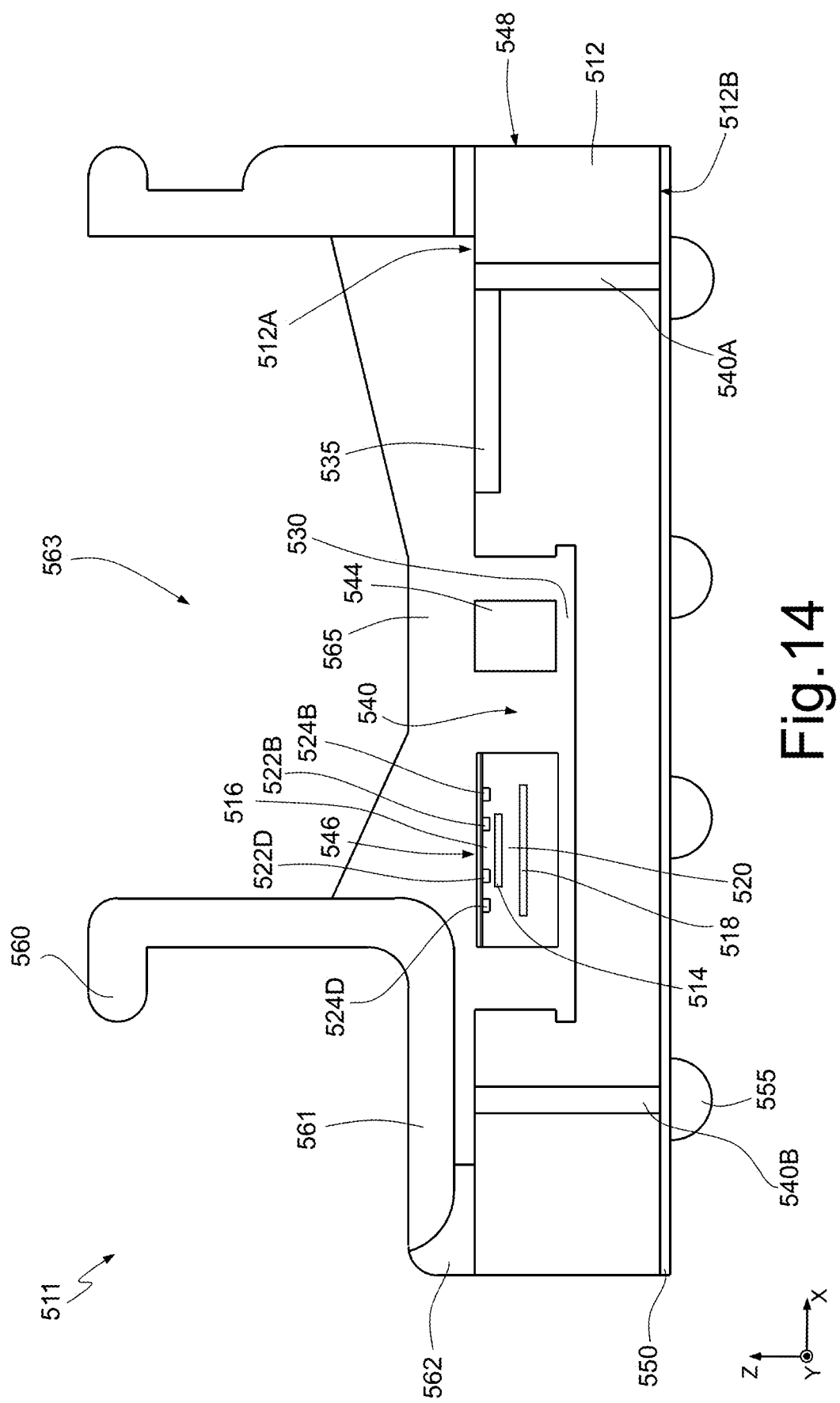
FIG. 14 is a schematic cross-section a MEMS pressure sensor according to another embodiment of the MEMS pressure sensor of FIG. 13.

FIG. 14 shows a MEMS pressure sensor 511 having a general structure similar to that of the MEMS pressure sensor 211 of FIG. 13 so that parts that are similar to the ones illustrated and described with reference to FIG. 13 are designated in FIG. 14 by reference numbers increased by 300 and will not be described any further.

In particular, the hollow cap 560 is, in this embodiment, of a Z-cap type; i.e., it has a bent portion 561 extending parallel to the first face 512A of the monolithic body 512 and covering part of the decoupling trench 540. In this way, the hollow cap 560 can reduce mechanical impact, for example in case the device is dropped.

Figure 15:
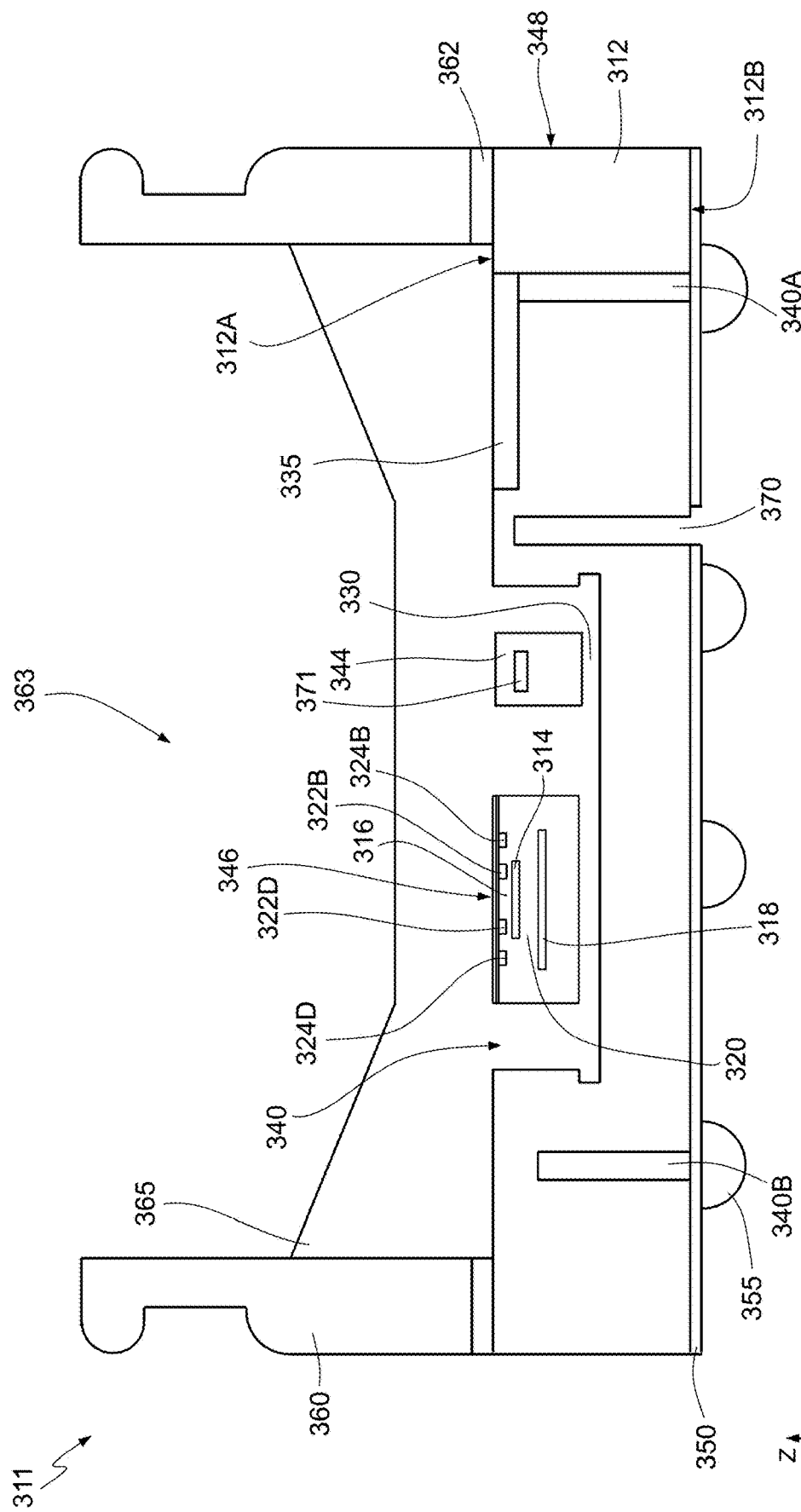
FIG. 15 is a cross-section taken along section line XV-XV of FIG. 16 of a MEMS pressure sensor according to another embodiment.
Figure 16:
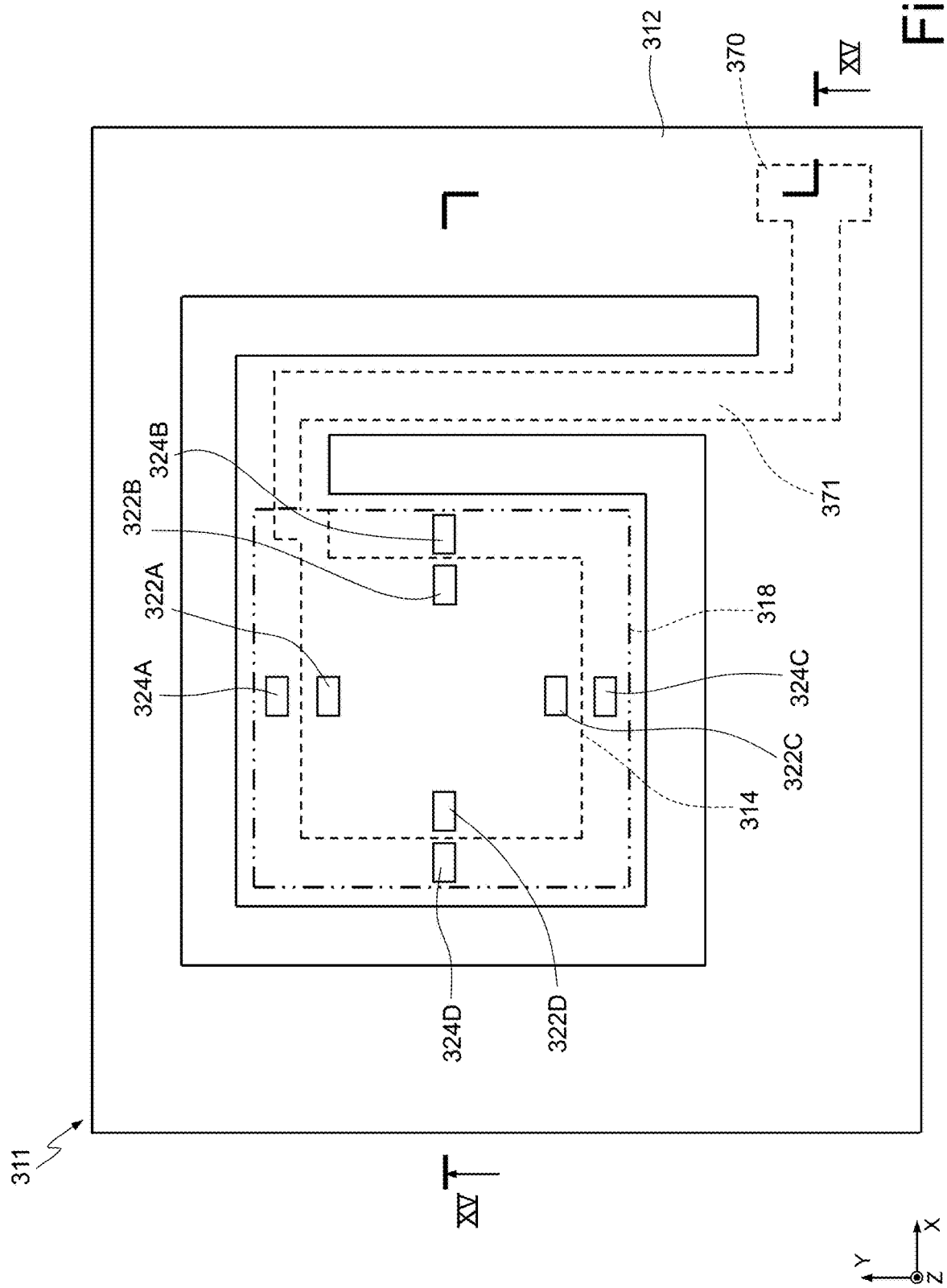
FIG. 16 is a schematic top plan view of the MEMS pressure sensor of FIG. 15.

FIGS. 15 and 16 show another embodiment of the present MEMS pressure sensor. In detail, FIGS. 15 and 16 show a MEMS pressure sensor 311 having a general structure similar to that of the MEMS pressure sensor 211 of FIG. 13 so that parts that are similar to the ones illustrated and described with reference to FIG. 13 are designated in FIGS. 15 and 16 by reference numbers increased by 100 and will not be described any further.

In detail, the first buried cavity 314 is connected, through an S-shaped channel 371 extending within the arm 344 (FIG. 16), to a fluidic-connection channel 370, extending from the second face 312B in a direction parallel to the first axis Z.

The fluidic-connection channel 370 enables connection of the first buried cavity 314 to the external environment, rendering the first membrane 316 of a differential type. Vice versa, the second membrane 320 is of an absolute type.

In use, the MEMS pressure sensor 311 has a behavior similar to what has been described for the MEMS pressure sensor 61 of FIG. 8.

Figure 17:
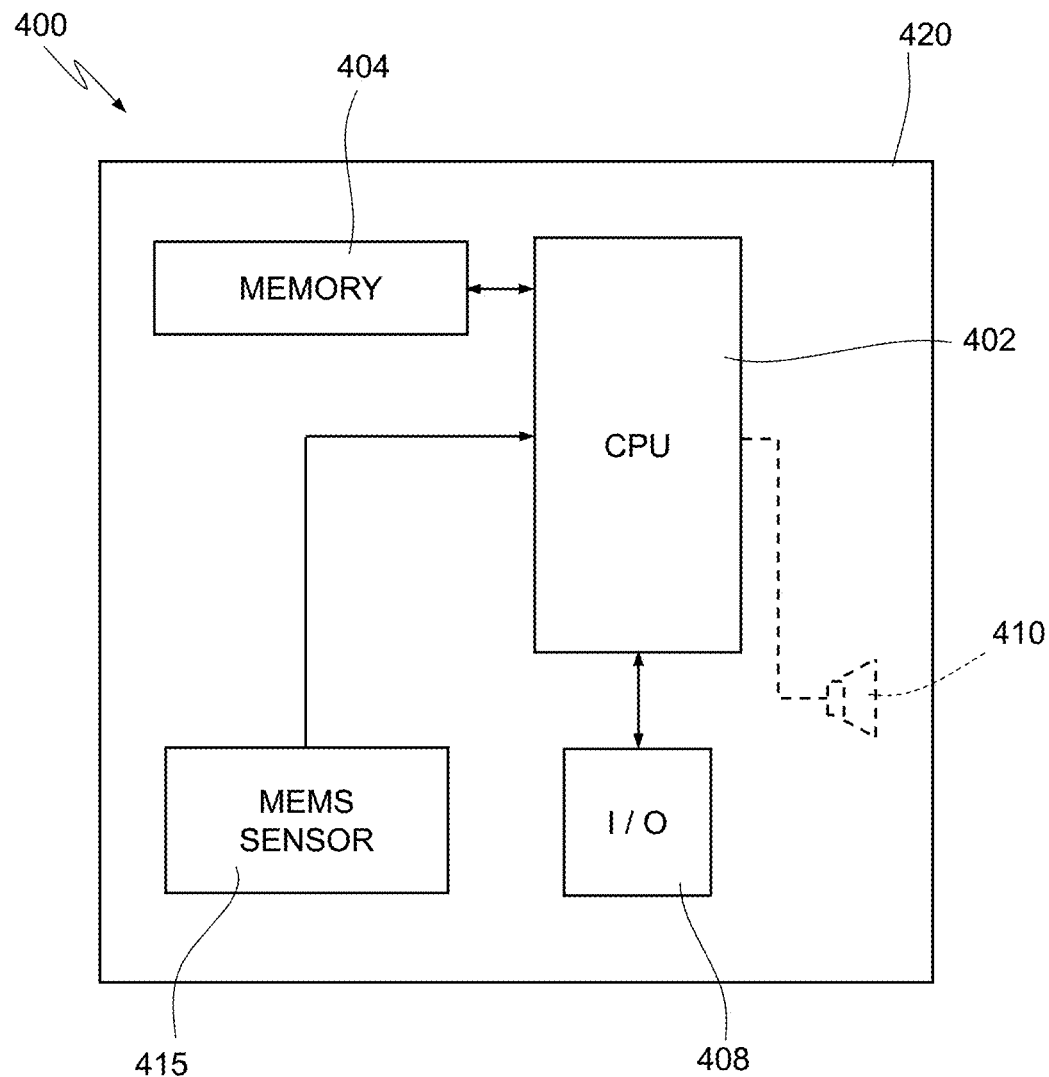
FIG. 17 shows an apparatus using a MEMS pressure sensor in accordance with one or more embodiments.

FIG. 17 is a schematic illustration of an electronic apparatus 400 that uses the present MEMS pressure sensor, here designated as a whole by the reference number 415, obtained according to one of the possible embodiments presented.

The electronic apparatus 400 comprises, in addition to the MEMS pressure sensor 415, a microprocessor 402, a memory block 404, connected to the microprocessor 402, and an input/output interface 408, which is also connected to the microprocessor 402. Moreover, the electronic apparatus 400 may comprise a speaker 410, for generating a sound on an audio output (not illustrated) of the electronic apparatus 400.

In particular, the electronic apparatus 400 is fixed to a supporting body 420, for example, constituted by a printed-circuit board.

The electronic apparatus 400 is, for example, an apparatus for measuring blood pressure (sphygmomanometer), a household appliance, a mobile communication device (such as a cellphone, a PDA—Personal Digital Assistant, or a notebook) or an apparatus for measuring the pressure that can be used in the automotive sector or the industrial sector.

The present MEMS pressure sensor presents numerous advantages.

In particular, the present MEMS pressure sensor occupies a smaller area with respect to the known solutions since the buried cavities are vertically set on top of one another (in a direction parallel to the first axis Z) instead of being set alongside one another (in a direction parallel to the second or third axis X, Y). This characteristic renders it advantageous for use in contexts in which small dimensions are called for, such as electronic systems or devices of small dimensions.

Moreover, as illustrated in FIGS. 3-5, the present MEMS pressure sensor operates in various pressure ranges without undergoing substantial losses in performance in each operating range, thus improving the reliability of the MEMS pressure sensor.

In addition, as discussed previously, the present MEMS pressure sensor enables a plot of the sensitivity S that is more linear with the increase of the pressure exerted on the MEMS pressure sensor in the pressure ranges in which the MEMS pressure sensor operates. Finally, the present MEMS pressure sensor is manufactured according to a simple and inexpensive manufacturing flow.

Finally, it is clear that modifications and variations may be made to the embodiments described and illustrated herein, without thereby departing from the sphere of protection of the present disclosure. For instance, the different embodiments described may be combined so as to provide further solutions.

Moreover, in other embodiments, the fluidic-connection channel 370 of the MEMS pressure sensor 311 of FIGS. 15 and 16 can communicate just with the second buried cavity 318 instead of with the first buried cavity 314, so that the second membrane 320 is differential and the first membrane 316 is absolute.

In further embodiments of the MEMS pressure sensor 311, two fluidic-connection channels may be present so that both the first membrane 316 and the second membrane 320 are differential.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS pressure sensor, comprising:
   a body of semiconductor material having a first face and a second face;
   a first buried cavity in the body;
   a first sensitive region in the body between the first buried cavity and the first face, the first sensitive region having a first depth;
   a second buried cavity in the body between the first buried cavity and the second face, the second buried cavity extending laterally beyond sides of the first buried cavity;
   a second sensitive region in the body between the second buried cavity and the first face, the second sensitive region having a second depth greater than the first depth and extending laterally with respect to the first sensitive region;
   a first piezoresistive sensing element in the first sensitive region; and
   a second piezoresistive sensing element in the second sensitive region.

2. The sensor according to claim 1, wherein the body of semiconductor material is a monolithic body of semiconductor material.

3. The sensor according to claim 1, wherein the first buried cavity has a first area in a first plane parallel to the first face, the second buried cavity has a second area in a second plane parallel to the first face of the body, the second area being greater than the first area.

4. The sensor according to claim 3, further comprising:
   a third buried cavity in the body between the second face and the second buried cavity, the third buried cavity extending laterally beyond sides of the second buried cavity;
   a third sensitive region in the body between the third buried cavity and the first face, the third sensitive region having a third depth greater than the second depth and extending laterally with respect to the second sensitive region; and
   a third piezoresistive sensing element in the third sensitive region.

5. The sensor according to claim 4, wherein the third buried cavity has a third area in a third plane parallel to the first face, the third area being greater than the second area.

6. The sensor according to claim 3, wherein the first buried cavity and the second buried cavity are concentric.

7. The sensor according to claim 1, further comprising:
   a first access channel extending in the body from the second face and in fluidic connection with one of the first buried cavity or the second buried cavity.

8. The sensor according to claim 7, further comprising:
   a second access channel extending in the body from the second face and in fluidic connection with the other one of the first buried cavity or the second buried cavity.

9. The sensor according to claim 1, further comprising:
   a decoupling cavity in the body between the second face and the second buried cavity, the decoupling cavity extending laterally beyond sides of the second buried cavity; and
   a decoupling trench extending in the monolithic body from the first face and communicatively coupled to the decoupling cavity.

10. The sensor according to claim 9, wherein the first buried cavity has a first area in a first plane parallel to the first face of the body, the second buried cavity has a second area in a second plane parallel to the first face, and the decoupling cavity has a third area in a third plane parallel to the first face, the third area being greater than the second area.

11. The sensor according to claim 9, wherein the decoupling trench has a spiral shape in the third plane and delimits an S-shaped arm that couples the first and second sensitive regions to a peripheral portion of the body.

12. The sensor according to claim 11, further comprising:
a fluidic-connection channel extending in the body from the second face; and
an S-shaped channel, which extends within the S-shaped arm and is coupled to the fluidic-connection channel and to one of the first buried cavity or the second buried cavity.

13. The sensor according to claim 9, further comprising:
a hollow cap coupled to the first face and having a cap opening, the cap opening exposing at least a portion of the first face of the body; and
a gel layer within the cap opening of the hollow cap and on the exposed portion of the first face of the body, the gel layer at least partially filling the decoupling cavity and the decoupling trench.

14. The sensor according to claim 1, further comprising:
an integrated electronic circuit in the body and positioned laterally with respect to the first sensitive region and the second sensitive region;
redistribution conductive regions on the second face of the body;
a plurality of conductive vias extending in the body from the second face and electrically coupling the integrated electronic circuit, the first sensitive region, and the second sensitive region to the redistribution conductive regions; and
a plurality of mechanical and electronic connection elements, electrically coupled to the redistribution conductive regions.

15. The MEMS pressure sensor of claim 1, wherein: the MEMS pressure sensor is disposed on a semiconductor substrate, and a microprocessor is disposed on the substrate, the microprocessor being electrically coupled to the MEMS pressure sensor and configured to receive signals transmitted by the MEMS pressure sensor.

16. A device, comprising:
a semiconductor substrate;
a MEMS pressure sensor on the substrate;
a microprocessor on the substrate, the microprocessor being electrically coupled to the MEMS pressure sensor and configured to receive signals transmitted by the MEMS pressure sensor;
a memory block coupled to the microprocessor;
an input/output interface coupled to the microprocessor; and
a speaker coupled to the microprocessor, the speaker being configured to generate and output an audible signal,
wherein the MEMS pressure sensor includes:
a body having a first face and a second face;
a first cavity in the body, the first cavity having a first width;
a first sensing region in the body between the first cavity and the first face, the first sensing region having a first depth;
a second cavity in the body between the first cavity and the second face, the second cavity having a second width greater than the first width;
a second sensing region in the body between the second cavity and the first face, the second sensing region having a second depth greater than the first depth;
a first piezoresistive sensor in the first sensitive region; and
a second piezoresistive sensor in the second sensitive region.

17. The device of claim 16, wherein the MEMS pressure sensor further includes:
a third cavity in the body between the second face and the second cavity, the third cavity having a third width greater than the second width;
a third sensing region in the body between the third cavity and the first face, the third sensitive region having a third depth greater than the second depth; and
a third piezoresistive sensor in the third sensitive region.

18. The device of claim 16, further comprising:
a hollow cap coupled to the first face of the body and having a cap opening, the cap opening exposing at least a portion of the first face of the body; and
a gel layer within the cap opening of the hollow cap and on the exposed portion of the first face of the body.

* * * * *